(12) United States Patent
Higashida et al.

(10) Patent No.: US 6,965,150 B2
(45) Date of Patent: Nov. 15, 2005

(54) SEMICONDUCTOR DEVICE

(75) Inventors: Syouji Higashida, Kyoto (JP); Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/926,454

(22) PCT Filed: Mar. 5, 2001

(86) PCT No.: PCT/JP01/01672

§ 371 (c)(1),
(2), (4) Date: Nov. 6, 2001

(87) PCT Pub. No.: WO01/67520

PCT Pub. Date: Sep. 13, 2001

(65) Prior Publication Data
US 2003/0057497 A1    Mar. 27, 2003

(30) Foreign Application Priority Data

Mar. 6, 2000  (JP) .............................. 2000-059710
Jan. 12, 2001  (JP) .............................. 2001-005627

(51) Int. Cl.$^7$ ........................ H01L 29/78; H01L 29/94; H01L 29/861
(52) U.S. Cl. ...................... 257/356; 257/173; 257/355; 257/368; 257/401; 257/577
(58) Field of Search .............................. 257/327–329, 257/339–341, 355–356, 173, 288, 365, 401, 257/577, 368

(56) References Cited

U.S. PATENT DOCUMENTS

| 4,963,970 A | * | 10/1990 | Throngnumchai et al. . 357/23.4 |
| 5,886,381 A | * | 3/1999 | Frisina ........................ 257/328 |
| 5,973,359 A | * | 10/1999 | Kobayashi et al. ......... 257/328 |
| 6,268,242 B1 | * | 7/2001 | Williams et al. ............. 438/237 |

FOREIGN PATENT DOCUMENTS

JP            410144938    *   5/1998    ......... H01L 29/866

* cited by examiner

Primary Examiner—Minhloan Tran
Assistant Examiner—Johannes Mondt
(74) Attorney, Agent, or Firm—Arent Fox PLLC

(57) ABSTRACT

A plurality of transistor cells (T) are arranged in the semiconductor layer (4). Ring-shaped p-type layers (1b) and n-type layers (1a) composed of polysilicon film are formed alternately on an insulating layer (6) in an outer side than the plurality of transistor cells (T) (the peripheral portion of chip), thereby forming a protective diode (1). The most outer layer of the protective diode (1) is contacted to the gate wiring (2) composed of metal film such as Al, which is formed circularly on the most external layer, and the most inner layer is contacted to the source wiring composed of metal layer, thereby the protective diode is connected between the gate and source of a transistor. As a result of this, the semiconductor device with the protective diode which has the small series resistance, can be formed without enlarging chip area and by using unoccupied space of chip, and realize protection function sufficiently, can be obtained.

5 Claims, 8 Drawing Sheets

SEMICONDUCTOR DEVICE

FIELD OF THE INVENTION

The present invention relates to a semiconductor device such that a protective diode is connected between a gate and a source of a MOSFET or an insulating gate-type bipolar transistor (IGBT). More specifically, the present invention relates to a semiconductor device which can reduce insertion resistance of the protective diode and increases electrostatic breakdown strength without enlarging a chip area.

BACKGROUND ART

Although a vertical MOSFET, for example, has been conventionally used as a switching device having a high-switching speed and a large output, the gate threshold voltage tends to reduce by thinning a gate insulating film. The thinner the insulating film, even a little energy such as a static electricity is easy to insulating broken down. Therefore, a structure in which a protective diode is inserted between a gate and a source to discharge a static electricity has been conventionally used. The protective diode becomes a bidirectional zener diode by forming a p-n junction at peripheral portion of a gate electrode pad consisting of polysilicon film and is connected between the gate and the source, and FIG. 9(a) shows a sectional view of the vertical MOSFET having a structure provided with such a protective diode.

That is, an $n^+$-type semiconductor layer 21 (epitaxial grown layer) as a drain area, is epitaxial grown on an $n^+$-type semiconductor substrate 21a, a p-type body area 22 is formed by diffusing a p-type impurity on a surface side thereof, and an $n^+$-type source area 23 is formed on a peripheral part of the body area 22. A gate electrode 25 is provided on a surface side of the semiconductor layer 21 positioned in an edge portion of the body area 22 and outside thereof through a gate oxide film 24. A source electrode (a source wiring) 27 is formed by Al through a contact hole provided on an interlayer insulating film 24 so as to connect with the source area 23, and a drain electrode which is not shown is formed on a back side of the semiconductor substrate 21a, thereby forming an FET portion 20.

As shown in a plan view of FIG. 9(b), the body area 22 is formed like a matrix, and a plurality of transistor cells are formed, whereby a power MOSFET corresponding to a high current is formed.

Further, in a protective diode 30 is provided in a gate electrode pad 33 consisting of a polysilicon film which is formed on a surface of a p-type area 31 formed on the n-type semiconductor layer 21 by diffusion same as the body area 22 through an insulating layer 32, and as shown in a plan explanation view of FIG. 10(a), an n-type layer 33a and a p-type layer 33b are alternately formed on a peripheral portion of the gate electrode pad 33, whereby the most peripheral n-type layer 33a having an n-p-n-p-n connecting structure is connected to the above-mentioned source electrode 27. As a result, as shown in an equivalent circuit diagram of FIG. 10(b), the protective diode 30 consisting of a bidirectilnal zener diode ZD is formed between a gate G and a source S of the FET. In FIG. 9, a numeral 35 corresponds to a gate electrode pad for bonding and a gate wiring made of a metal such as Al formed to connect with the gate electrode pad 33 consisting of a polysilicon.

As mentioned above, a conventional protective diode has a structure that the diode is provided on the peripheral portion of the gate electrode pad consisting of the polysilicon. In the structure provided on the peripheral portion of the gate electrode pad, a joint area of the protective diode (a length in a perpendicular direction for a p-n junction and a peripheral length of the gate electrode pad) cannot be enlarged sufficiently. Therefore, a withstanding voltage (breakdown voltage) can not be improved sufficiently since a series resistance of the protective diode is increased, there is a problem that the property is deteriorated due to becoming narrower a transistor cell, or a chip dimension must be enlarged, since the gate electrode pad must be enlarged.

The present invention is made to solve such problems, and an object of the present invention is to provide a semiconductor device having a protective diode that has a low series resistance and can realize its protective function sufficiently with utilizing unoccupied peripheral portion of a chip without enlarging a chip area (dimension).

Another object of the present invention is to provide a semiconductor device having a structure that can transmit signals by a wiring, having a low resistance, on the whole of transistor cells, by utilizing the protective diode provided the peripheral portion of the chip without providing a gate finger in transistor cells.

Still another object of the present invention is to provide a semiconductor device having the protective diode that can improve a breakdown strength by preventing a damage due to a partial breakdown of the protective diode or reducing a series resistance by selection of material thereof or enlarging a joint area.

Still another object of the present invention is to provide a semiconductor device having a structure that improves a withstanding voltage of the most peripheral cell of transistor cell group.

DISCLOSURE OF THE INVENTION

The present inventors were devoted to study sufficiently for improving a breakdown strength against a surge and the like of a vertical MOSFET and the like, as a result, it is found out that even if a protective diode such as a zener diode is inserted between a gate and a source, when a series resistance between the gate and the source increases, a gate insulating film breaks down before discharge by the protective diode, so that the protective diode can not realize its function sufficiently. And, it is found out that a breakdown strength can be improved by that the protective diode has a structure of p-n junction as wide as possible (the length in the perpendicular direction for the p-n junction is longer), and a connecting structure which has no series resistance element by contacting directly with metal wiring without using semiconductor layer.

A semiconductor device according to the present invention has an insulating gate field effect transistor formed by arranging a plurality of transistor cells connected in parallel in a semiconductor layer and a protective diode connected between a gate and a source of the insulating gate field effect transistor to break down an input of constant voltage or more applied between the gate and the source, wherein the protective diode is formed as a bidirectional diode by forming one or more ring-shaped p-type layers and one or more n-type layers alternately and flatly on an insulating film at a peripheral portion than the arranged transistor cells, metal films contacting in ring-shape to the most inner layer and the most outer layer of the p-type layer or the n-type layer, and each of the metal films is successively formed with either a source wiring or a gate electrode pad consisting of a metal film, respectively. Here, to contact in ring-shape means that is to successively or intermittently contact along circumference of the p-type layer or the n-type layer provided in ring-shape.

In such a structure, a peripheral side of arranged transistor cells becomes a peripheral portion of a semiconductor chip, the semiconductor chip typically has a space (field portion) for acquiring an end of a depletion layer around of a cell active area or in a peripheral portion of a chip, and the protective diode is formed on an insulating film in the space. Therefore, the protective diode is formed using a conventional unoccupied space without enlarging a chip area.

Moreover, by forming the protective diode in ring-shape on the peripheral portion of the chip, the circumference length (the length in a perpendicular direction for a p-n junction direction, that is a p-n junction area) is formed approximately maximum for the chip size, thereby considerably lowering the series resistance in the p-n junction direction. In addition, a ring-shaped metal film is contacted on the most inner and the most outer semiconductor layers of the protective diode while either of the gate electrode pad or the source wiring is integrally connected to the most inner and the most outer ring-shaped metal films, so that considerably lower resistance is obtained since a diffusion area, a polysilicon film or the like is not used in a connector of both ends of the protective diode. As a result, the semiconductor device has a built-in protective diode having the very large breakdown strength without enlarging chip area and can be protected against static electricity.

One ring-shaped metal film contacted with the most outer layer is a gate wiring successively formed with the gate electrode pad, and the other metal film contacted with the most inner layer is the source wiring, so that the ring-shaped metal film, the gate electrode pad and the source wiring can be formed as one layer simultaneously and easily.

The one ring-shaped metal film is a gate wiring which has gate connecting portions so as to connect with gate electrodes of the transistor cells with partial striding over the protective diode, and the gate connecting portions and the source connecting portions of the source wiring which are contacted with the most inner layer are formed alternately in plan view to connect with gate electrode of each cell by metal wirings from the external part of chip, therefore signals can be transmitted to all cells and even cells in the far position from the gate electrode pad in a chip without attenuation and time-lag without providing a gate finger.

The p-type layer and n-type layer are composed of at least one selected from polysilicon, amorphous silicon, single-crystal silicon on an insulating layer, SiC and SiGe. Particularly, it is preferable that the layers are composed of SiC due to its low resistance value, approximately ⅒ of resistance of silicon.

The p-type layer and the n-type layer are formed so as to have the same width and the same concentration of impurities, in the same conductivity type respectively. It is preferable that a breakdown strength is improved as a whole since power is distributed to all layers uniformly and is not concentrated on a certain layer when p-type layers and n-type layers comprising of the plurality of layers, even if high power, e.g. surge, is supplied thereto.

A diffusion region having difference conductivity type from that of the semiconductor layer (substrate) is formed on the closest side to the protective diode of the arranged transistor cells, and the source wiring contacted to the most inner layer of the protective diode is also contacted to the diffusion region, so that it will be a field plate and a withstanding voltage will be improved.

According to another aspect of the semiconductor device of the present invention, a structure as claimed in claim 1, wherein the p-type layer and the n-type layer consisting of the bidirectional diode are not planar alignment but are formed alternately in a height direction, and in such a structure, since a joint area of p-n junction can be enlarged greatly and a series resistance is lowered and operates surely as a diode for absorption such as a surge while a large current can be obtained, so that a breakdown withstanding strength (amount) is also further improved.

BEST MODE FOR CARRYING OUT THE INVENTION

Figure 1:
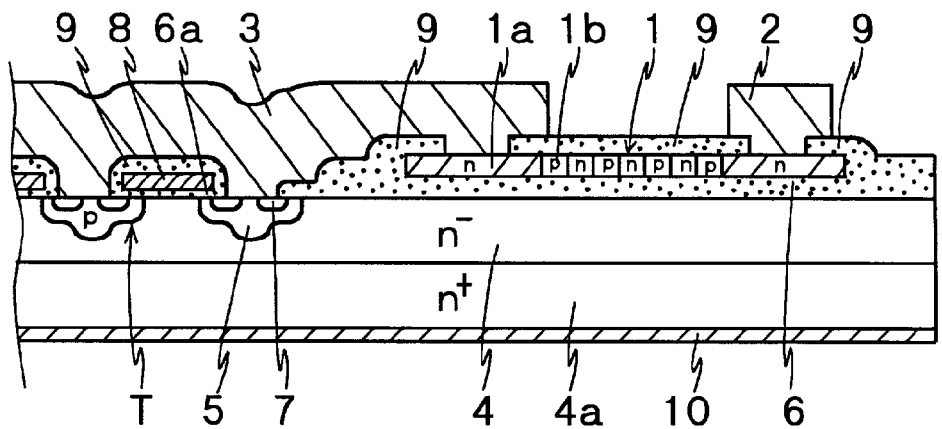
FIGS. 1(a) and 1(b) are explanation sectional and plan views showing an embodiment of a vertical MOSFET according to the present invention.
Figure 1:
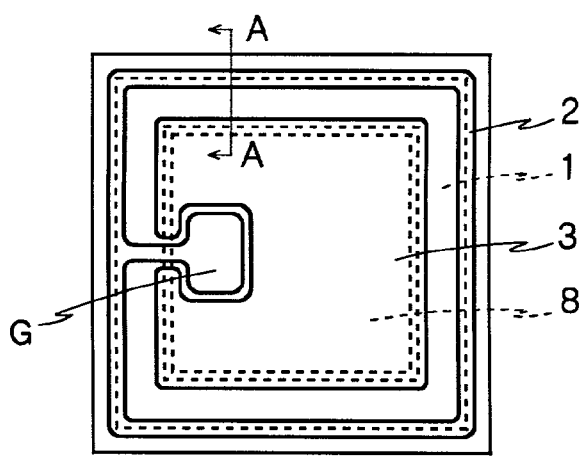

A description will be given of a semiconductor device according to the present invention with reference to drawings. The semiconductor device according to the present invention comprises a semiconductor layer 4 having a plurality of arranged transistor cells T, as shown in FIG. 1 showing a sectional view of an example for peripheral part of chip of a vertical MOSFET (A—A cross-section of FIG. 1(b)) and an explanation plan view of whole of a chip. A polysilicon film is formed on an insulating film formed on an outer side than the plurality of arranged transistor cells T (the edge side of the chip), and ring-shaped p-type layers 1b and n-type layers 1a are formed alternately and flatly in the polysilicon film to form a protective diode 1. The most outer layer is contacted with a ring-shaped gate wiring 2 successively formed with a gate electrode pad which is composed of metal film such as Al, and the most inner layer is contacted with a source wiring 3 composed of metal film, there by the protective diode 1 is connected between a gate and a source of the transistor.

As mentioned above, the present inventors were devoted to study sufficiently about further improving of a breakdown strength, as a result, it is found out that even if a protective diode against surge is inserted between a gate and a source of a vertical MOSFET, they can not get desire breakdown strength, and in case of the protective diode such as a zener diode is inserted between a gate and a source, if the series resistance between a gate and a source will increase, a gate insulating film is broken down before discharging by the protective diode and the protective diode can not realize its function. That is, it is found out that since the protective diode has the series resistance by itself and by connecting via the diffusion area of the semiconductor layer, its resistance value has an effect on damage of the vertical MOSFET before the protective diode functions sufficiently.

For example, it is found out that its resistance value is influenced grately by concentration of impurities doped in the polysilicon film constituting the protective diode 1, the length (the length in the p-n junction direction; the length in the perpendicular to p-n junction surface direction), the width (the length in the perpendicular to p-n junction direction; p-n junction area). The concentration of impurities doped in the polysilicon film and its length (the length in the p-n junction direction) has an effect on a voltage breaking down the protective diode, thus the resistance value can not be set to only reduce, but its width (the length in the perpendicular to p-n junction direction) has an effect on only resistance irrespective of the voltage breaking down and its series resistance can be decreased if its width is enlarged as large as possible, that is, ring of p-n junction is formed on enlarging peripheral portion of the chip.

Figure 8:
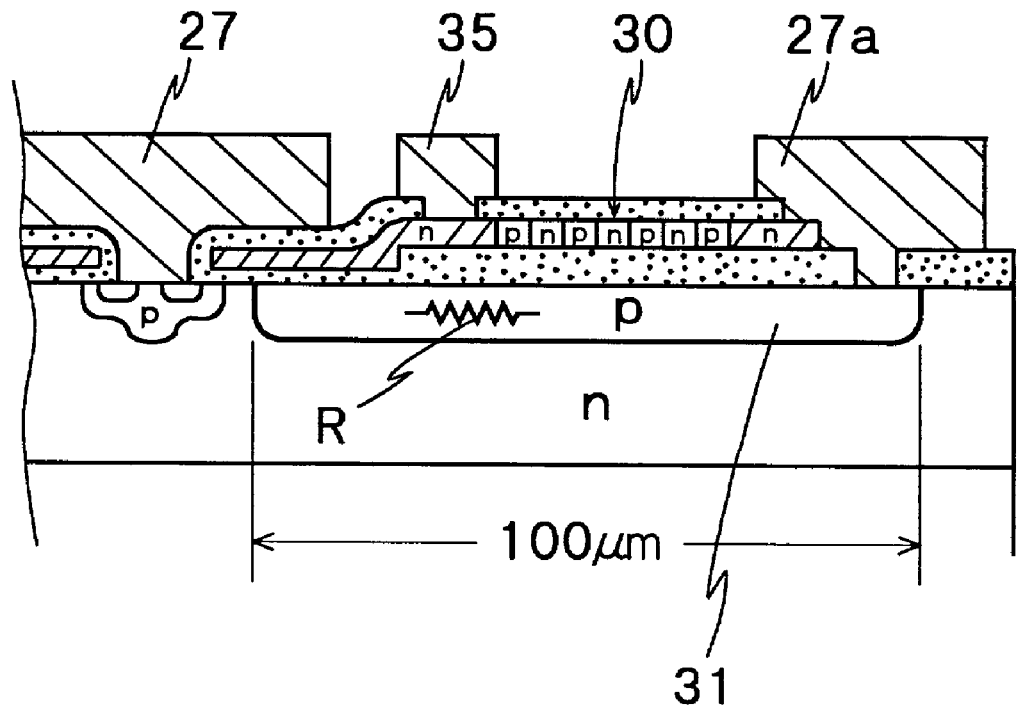
FIGS. 8(a) and 8(b) are explanation views showing a problem in case of connecting of a protective diode through a diffusion area on a semiconductor layer.
Figure 8:
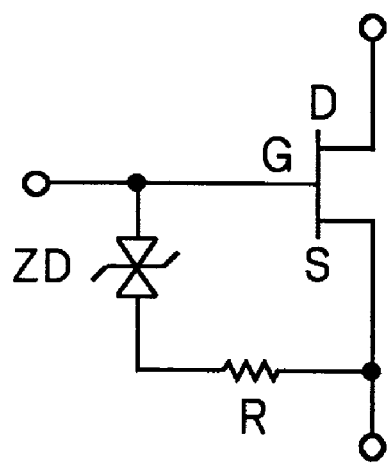
Figure 9A:
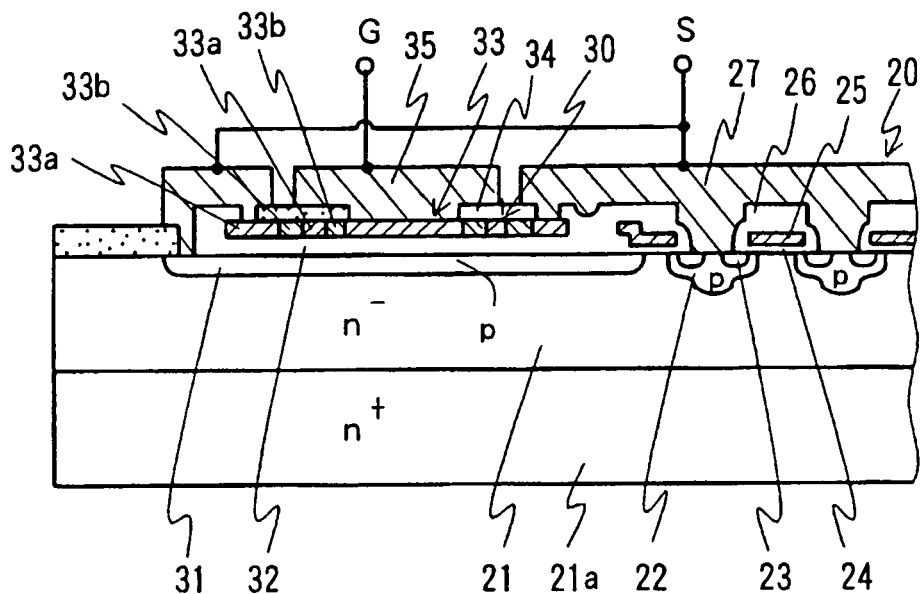
FIGS. 9(a) and 9(b) are explanation sectional and plan views showing a vertical MOSFET having a conventional protective diode.
Figure 9B:
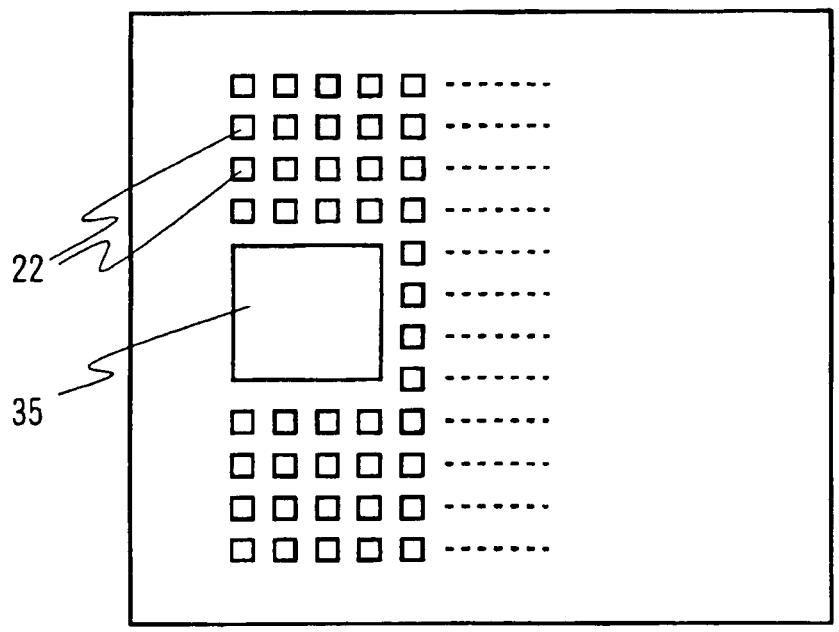
Figure 10A:
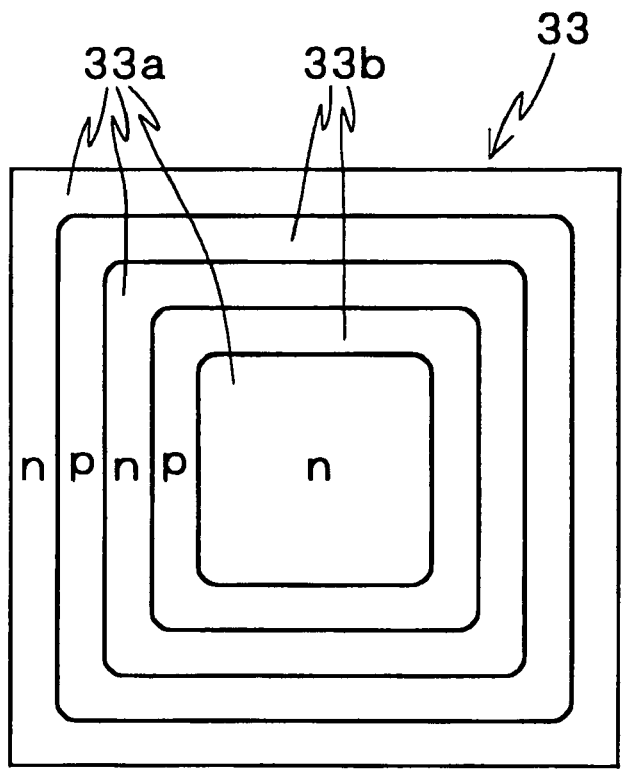
FIGS. 10(a) and 10b are explanation views showing an electrode pad having a protective diode shown in FIG. 9(a).
Figure 10B:
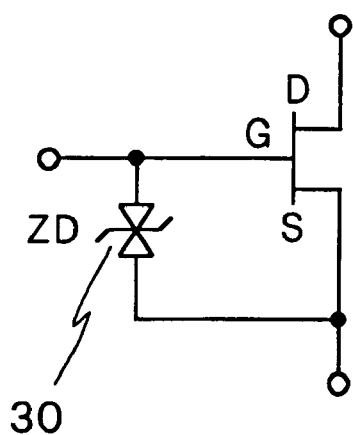

Further, even if the protective diode 30 is formed on the outer portion of the same chip, for example, shown in FIG. 8(a), when the source wiring 27a is formed on the edge side of the chip, if the source wiring 27a is not connected to the source wiring 27 via a p-well 31 formed on the surface of the semiconductor layer it can not formed at the same time with a gate wiring 35 and a gate electrode pad composed of metal film, and when the source wiring 27a is connected by a diffusion area such the p-well 31, sheet resistance of the diffusion area is, for example, approximately 200 $\Omega/\square$ (100 to 1,000 $\Omega/\square$). So, in case of the length in connecting direction of the diffusion area 31 is 100 $\mu$m (refer FIG. 8(a)), the perimeter of the chip is 1 mm×4=4 mm, a wiring resistance R between a source and a gate is R=100 $\mu$m/4 mm×200 $\Omega/\square$=5 $\Omega$(2.5 to 25 $\Omega$).

That is, as shown in FIG. 8(b) showing an equivalent circuit diagram, a structure has approximately resistance R=5 $\Omega$ is connected in series. In this state, the resistance value after breakdown of the protective diode must be reduced to approximately 10 $\Omega$ to increase the electrostatic breakdown strength, however it is almost impossible to reduce the resistance value due to the required concentration of impurities for the breaking down voltage. Therefore, such diffusion area can not be used even as a part in the connection structure of the protective diode, so it is found out that a wiring having low resistance is required being used for the connection structure.

As shown in FIG. 1(b) showing the explanation plan view of Al pattern formed for a gate wiring 2 and a source wiring 3, the protective diode according to the present invention is formed in ring-shape on the peripheral part of the semiconductor chip. In a vertical MOSFET shown in FIG. 1(a), for example, as shown in FIG. 1(a) showing a part of it, transistor cells indicated as p-type body areas 5, are formed like a matrix. Thus, a space can not be formed in the cell active area, but there is a space (field portion) having a certain area in the external part of cell active area (the area where formed the source wiring 3 formed), the external part of semiconductor chip so as to terminate depletion layer in each of cells from cell as far as possible. For example, a polysilicon film is overlaid on the insulating film (field oxide film) 6 composed of $SiO_2$ in the field portion, as well as the gate electrode pad composed of polysilicon and the gate electrode 8 of cells, and is patterned, then the n-type layers 1a and the p-type layer 1b are arranged alternately, the plurality of p-n junctions are formed in series in a horizontal direction.

Above-mentioned polysilicon film is formed so as to have a thickness of approximately 0.5 $\mu$m, for example, the n-type layer 1a having a width of approximately 4 $\mu$m and the p-type layer 1b having a width of the same are formed in ring-shape to form a bidirectional diode. The concentration of the n-type layer 1a and p-type layer 1b are, for example, approximately $5 \times 10^{20}$ $cm^{-3}$, $7 \times 10^{17}$ $cm^{-3}$, the concentration of impurities and the number of p-n junctions are controlled so as to get desire break down voltage. In manufacturing of the protective diode 1 by the n-type layer 1a and the p-type layers 1b, for example, the p-type dopant is doped on whole of the polysilicon film, then the n-type dopant is doped in ring-shape so as to have the concentration of impurities whereby the n-type layer 1a and the p-type layer 1b are doped alternately and flatly, thereby forming the bidirectional zener diode.

The breakdown voltage of the protective diode 1 can be almost controlled by adjusting the concentration of impurities as mentioned above, the concentration of impurities is adjusted ordinarily so as to have one diode having approximately 5 to 10 V of breakdown voltage. Moreover, for example, the protective diode is formed by forming three to four p-n junctions so as to break down at 20 to 30 V.

The gate wiring 2 is contacted to the most outer n-type layer 1a of the protective diode 1. That is, as shown in FIG. 1(a), for example, after the protective diode composed of polysilicon and the gate electrode 8 of transistor cell are formed, then the interlayer insulating layer 9 is formed and a contact hole is opened on the most external portion and the most internal portion of the protective diode 1, as shown in FIG. 1(b), the gate wiring 2 being the continuation of the gate electrode pad, and the source wiring 3 are formed by patterning metal film such as Al film, formed on the whole of semiconductor device. As a result, the protective diode has a structure connected between the gate and the source by metal film wiring.

As shown in one part in FIG. 1(a), transistor cells are formed as follows, for example, the body regions 5 are arranged like a matrix by doping the p-type dopant into the surface of n-type epitaxial grown layer 4 having resistivity of approximately 0.1 $\Omega$·cm to tens $\Omega$·cm and a thickness of approximately a few $\mu$m to tens $\mu$m grown epitaxially on the $n^+$-type semiconductor substrate 4a having a thickness of approximately 300 $\mu$m, then the source regions 7 are formed by doping n-type impurities into the outer portion of the body regions 5, and the gate electrodes 8 are formed through the gate oxide film 6a on the channel regions around the body regions 5 formed between the source regions 7 and the n-type semiconductor layer 4. In the vertical MOSFET, the body regions 5 are formed like a matrix, as mentioned above, and the plurality of transistor cells are connected in parallel to get high electric current.

Further, as mentioned above, the gate electrodes 8 are formed by patterning polysilicon film at the same time with forming the protective diode portion 1 and doping one kind of dopant. The interlayer insulating layer 9 is provided on the gate electrodes 8, then the contact hole is opened, as mentioned above, the source wiring 3 contacts to the source regions 7 of each transistor cells by providing Al or the like by vacuum deposition or the like. Further, the drain electrode 10 is formed on the backside of the semiconductor substrate 4a (which is shown thinner than other parts in FIG. 1) by depositing the metal for the electrode by the vapor deposition or the like.

Due to the structure of the semiconductor device according to the present invention, the protective diode 1 is formed so that the length in the perpendicular direction against the p-n junction direction (p-n junction area) is equivalent to the length of the circumference of the chip and almost the largest length, and the both edges of it are connected directly to the gate and the source by metal film made of Al or the like. Therefore, the series resistance between the gate and the source can be reduced substantially. That is, wiring resistance by metal film can be approximately zero. As a result, its insert resistance can be lowered sufficiently, electrostatic breakdown strength can be increased sufficiently and ordinary breakdown strength, approximately 120 V, can be improved to approximately 1,000 V by adjusting desire concentration of impurities to get the breaking down voltage (the break down voltage is increased by enlarging of depletion layer due to reducing the concentration of impurities).

Moreover, according to the present invention, the protective diode is formed by using field part around the semiconductor chip where the device can not be formed because of holding the depletion layer, thus it is not required that the semiconductor chip area is enlarged. Further, the gate wiring and the source wiring can be formed at the same time and the effective protective diode can be produced without increasing manufacturing steps, since the gate wiring is contacted with the external layer of the protective diode. As a result, a region broken down easily such as the gate insulating film, is protected surely against applying static electricity and surge having larger power than the predetermined break down voltage with controlling break down voltage in accordance with the intended use.

Figure 2:
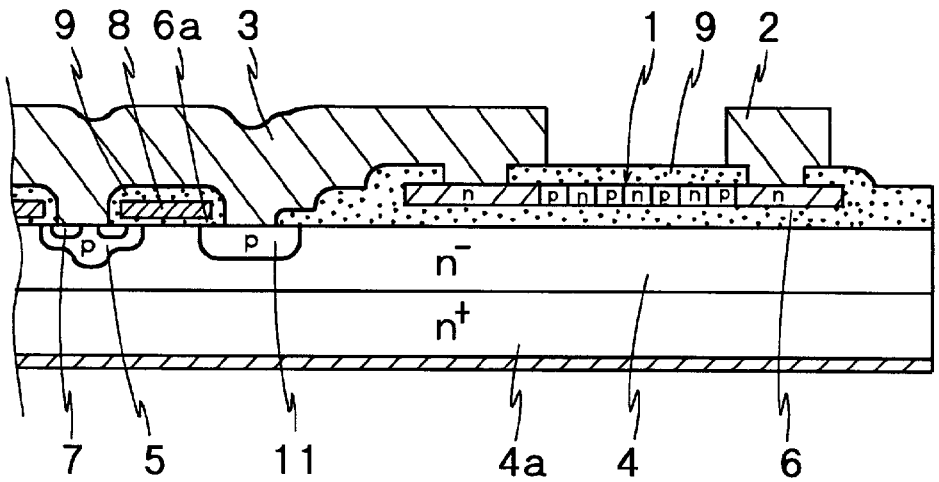
FIG. 2 is an explanation a sectional view showing a modified example of the vertical MOSFET shown in FIG. 1.

In the above-mentioned example, the transistor cells are formed up to the side of the edge of the semiconductor chip, it is preferred that the transistor cells are not formed on the endmost edge of the transistor cell group and only p$^+$-type areas 11 as same as body area are formed therein, the source wiring 3 is contacted with the diffusion regions 11, as shown in FIG. 2 showing the explanation section view as same as FIG. 1(a). As a result, the large curvature of depletion layer can be obtained and the concentration of electric field can be prevented, thus the breakdown strength can be improved. In FIG. 2, the explanation is omitted with marking the same signs which are corresponding to the same parts in FIG. 1.

Figure 3:
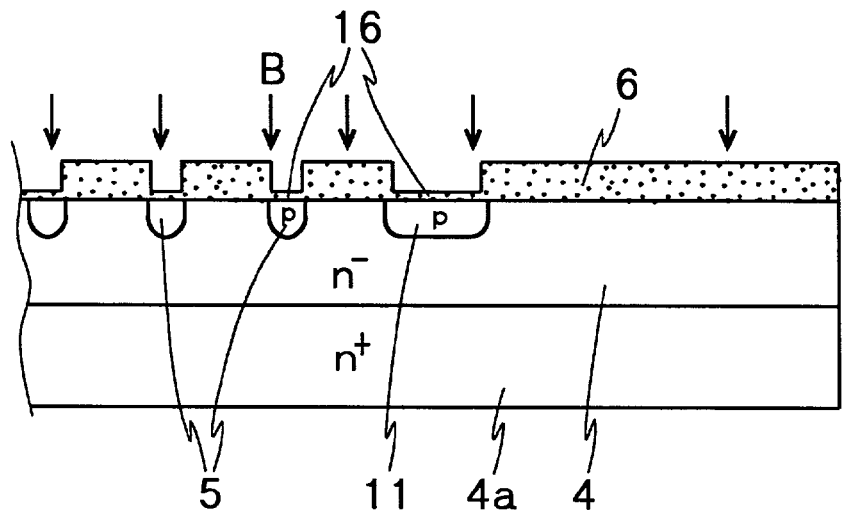
FIGS. 3(a) to 3(e) are explanation views showing manufacturing steps for an example shown in FIG. 2.
Figure 3:
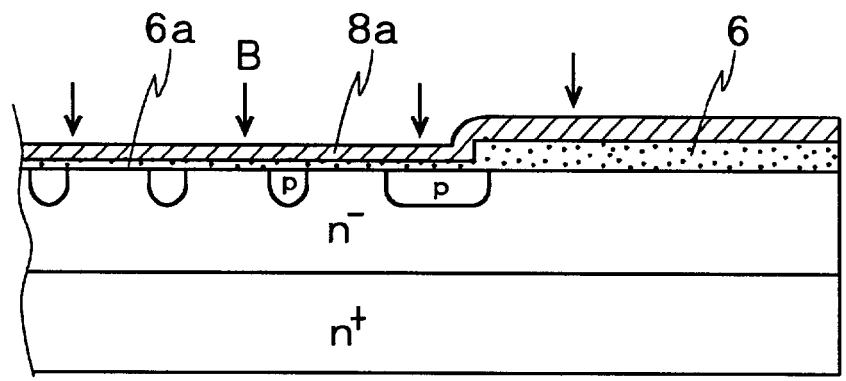
Figure 3:
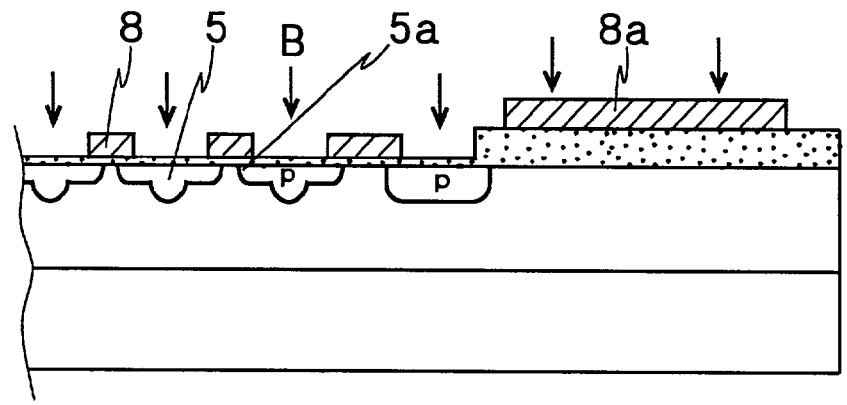
Figure 3:
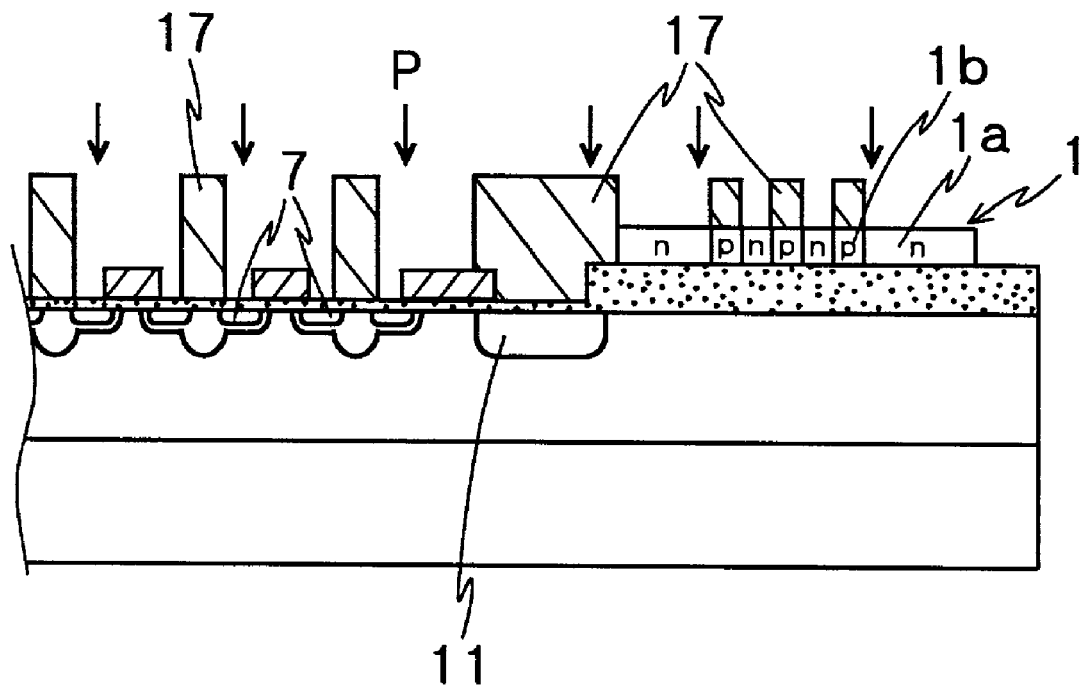
Figure 3:
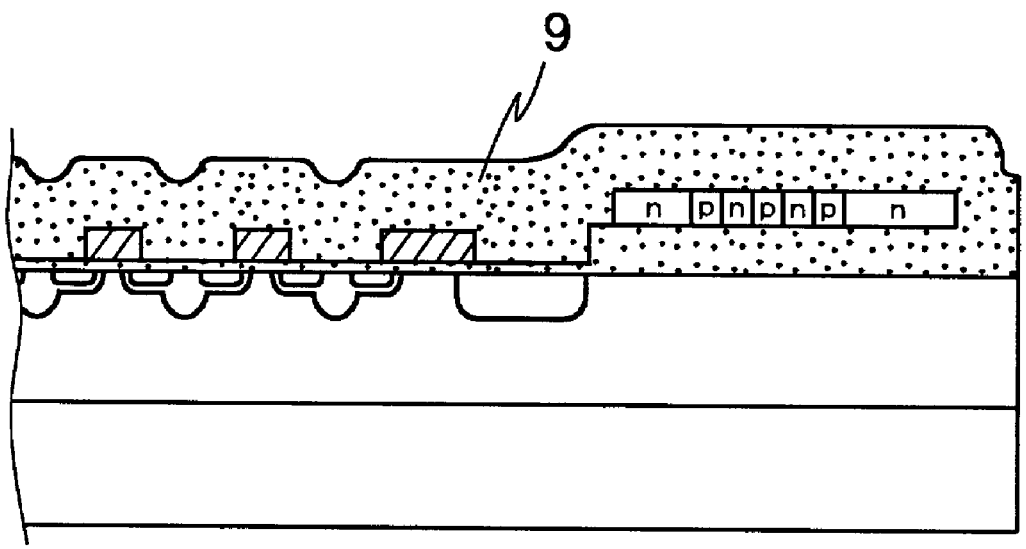

Next, A description will be given of manufacturing steps for semiconductor device having a structure shown in FIG. 2. At first, as shown in FIG. 3(a), an n-type epitaxial grown layer 4 having resistivity of 0.1 Ω·cm to tens Ω·cm and a thickness of a few $\mu$m to tens $\mu$m is grown on the n$^+$-type silicon substrate 4a being a drain. Then the oxide layer 6 having a thickness of several hundred nm is formed on there, the through oxide film layer 16 is formed by etching so as to open the part where the body regions 5 and the p$^+$-type diffusion regions 11 formed. Then, the boron (B), the p$^+$-type dopant, is ion-implanted and the p-type body regions 5 and the p$^+$-type diffusion regions 11 are formed by diffusing in the heat treatment.

Next, as shown in FIG. 3(b), the oxide film in an active region, that is, the cell region is removed and a gate oxide film 6a is formed and a polysilicon film 8a for the gate electrode is deposited. The desire concentration to obtain the desire breakdown strength of the protective diode is realized by ion-implanting p-type element ion, e.g. B ion.

Furthermore, as shown in FIG. 3(c), the polysilicon film 8a is patterned so as to form the gate electrode 8 to form the cell part, then the p-type dopant, e.g. B ion, is ion-implanted using the gate electrode 8 as a mask, the channel region 5a is formed by heat diffusion. In ion-implanting, the polysilicon film 8a of the protective diode also is ion-implanted. When the concentration of ion-implanting is considerably lowered, it does not arise any problems, but when the amount of doze in this ion-implanting is approximately 10$^{13}$ cm$^{-2}$, withstanding voltage of the protective diode 1 is controlled by the sum of concentrations of the first p-type ion-implanting and the p-type ion-implanting for forming the channel.

Then, the mask 17 shown in FIG. 3(d) is formed by photresist, the n-type element ion is ion-implanted and the source area 7 is formed by the anneal treatment. In this case, the diffusion regions 11 are covered by the masks 17 so as not to ion-implant the n-type ion, and the masks 17 are formed on not only the diffusion regions 11 but also the protective diode simultaneously, as shown in FIG. 3(d), and the protective diode having p-n junction, having the n-type layers 1a and the p-type layers 1b are formed by ion-implanting the same n-type dopont and anneal treatment.

Then, as shown in FIG. 3(e), the interlayer insulating film 9 composed of PSG and the like is deposited by CVD at normal pressure. The contact hole is formed by patterning, the gate wiring 2, the gate electrode pad G and the source wiring 3 composed of metal film are formed by vapor deposition of Al and patterning to form the vertical MOSFET having the structure shown in FIG. 1. In this case, as shown in FIG. 1(b), the gate wiring 2 is patterned and formed so as to continue with the gate electrode pad G and cover to outside than the most external part of the protective diode 1.

Figure 4:
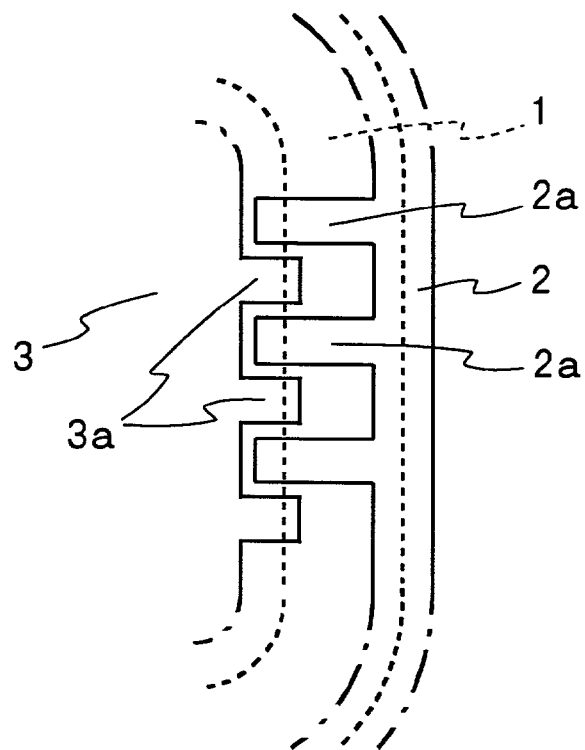
FIG. 4 is an explanation view showing an example shown in FIG. 1, and a pattern of a gate wiring and a source wiring in case of the most external gate wiring connecting to cell gate electrode.

In the above mentioned example, the protective diode has the structure having the most internal layer of the protective diode connected to the source electrode and the most external layer connected to the metal layer on the external side by connecting to the gate electrode pad. The cells formed in the far position from the gate electrode pad are connected to the gate electrode of each cell through a polysilicon layer, so resistance value will increase and signal transmitting will delay. The structure having the component called gate finger composed of metal film is installed between partial cell rows may be adopted to solve the above problem, but installing gate finger rises the problem of reducing of the number of cells. However it will be possible to connect to even gate electrodes of the cells in the far position from the gate electrode pad, through the metal film formed on the external part of the chip because the structure having the metal film connected to the gate electrode pad, formed on the external part of the chip according to the present invention is adopted, thus the signal transmitting to all cells will can be made early That is, as shown in FIG. 4 showing the explanation plan view of a partial of the gate wiring 2 formed on the most outer portion and the source wiring 3, connecting portion 3a for connecting the source wiring 3 and the most internal layer of the protective diode 1 and connecting portion 2a for connecting each gate electrodes of the cells and the gate wiring 2 are formed alternately in plain view, as shown in FIG. 4, they are formed in patterns of combs, which teeth are engaged each other. With thanks of this, the gate electrode pad can be connected to the most external cells in the cell group thorough the metal film.

Figure 5:
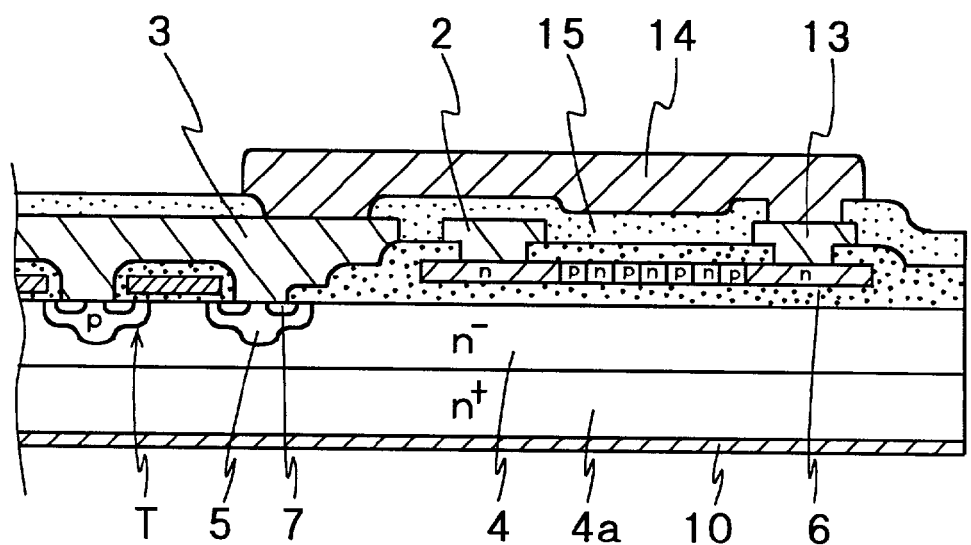
FIG. 5 is an explanation sectional view showing a modified example shown in FIGS. 1(a) and 1(b), as same as FIG. 1(a)

In each of the above examples, the most inner n-type layer or p-type layer and the source wiring are contacted in series and the most outer n-type layer or p-type layer and the gate wiring are contacted in series to contact the most external and the most internal of the protective diode by using metal film, e.g. Al, it is preferable because all metal electrode films can be formed by single patterning. But, as shown in FIG. 5, the most inner n-type layer or p-type layer of the protective diode and the gate electrode pad 2 may be contacted directly and the most outer n-type layer or p-type layer and the source wiring may be contacted directly. Thereby, manufacturing steps for the semiconductor device increase since it is required that the source wiring 3 and the metal wiring 13 contacting to the most outer n-type layer or p-type layer are connected by the metal wiring 14 installed again through the insulating layer 15. However, both edges of the protective diode can connect the source wiring 13 and the gate electrode pad directly by only metal wirings, so the protective diode 1 having the low series resistance can be inserted between the source and the gate.

Furthermore, in the above mentioned example, although the protective diode is made from polysilicon, even if polysilicon is not used for the protective diode, components forming n-type layer and p-type layer can be used for it, amorphous silicon, single-crystal silicon formed on an insulating layer, single-crystal, polycrystalline or amorphous SiC and SiGe and the like can be used for it. Particularly, SiC has the low resistance value, $\frac{1}{10}$ of the resistance of silicon, and has a great effect to reduce the series resistance.

Figure 6:
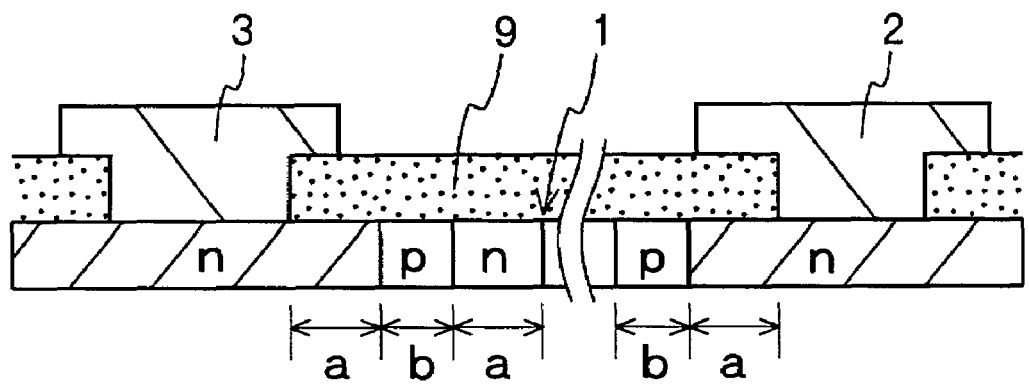
FIG. 6 is a partial explanation sectional view showing another modified example shown in FIG. 1(a) as same as FIG. 1.

In addition, in the above mentioned examples, although the n-type layers 1a and p-type layers 1b constituting the protective diode 1 are formed in the same width, as shown in FIG. 6, the width a of the n-type layers 1b and the width b of the p-type layer 1b may be different. However it is preferable that the width and the concentration of the impurities of each of the n-type layers is the same and the width and the concentration of the impurities of each of the p-type layers is the same, respectively. Because the weakest layer is broken down easily by concentration of the surge when surge is applied in the case of forming the plurality of n-type layers and p-type layers. If each layer is formed uniformly, applied surge is distributed equality to each layer thereby breakdown strength increases, it is preferable that breakdown strength is improved.

Figure 7:
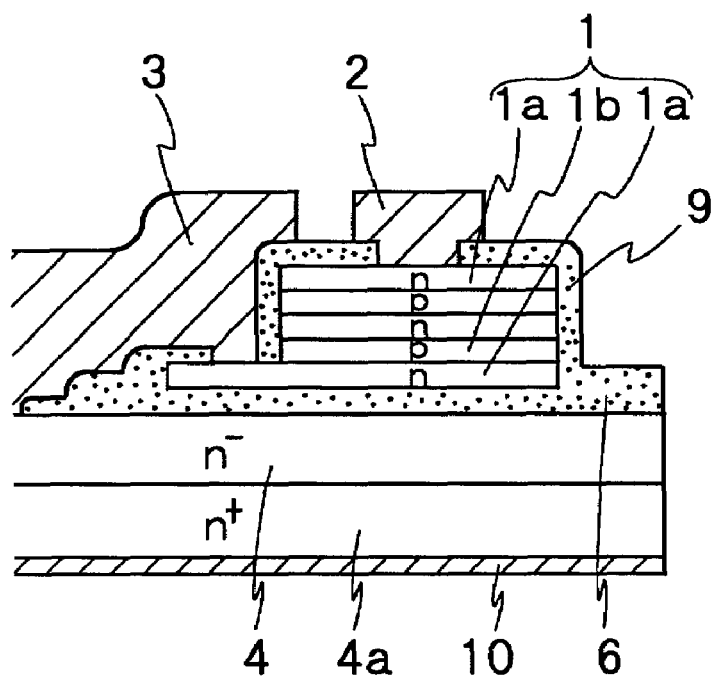
FIG. 7 is an explanation sectional view showing another example according to the present invention as same as FIG. 1(a)

In the above mentioned example, the n-type layers and the p-type layers of the protective diode are formed alternately and flatly, because of such a structure the protective diode can be formed by only forming a single semiconductor layer, patterning and doping. But as shown in FIG. 7, n-type layers 1a and p-type layers 1b may be deposited vertically. In this case, each layer has a thickness of approximately 0.5 to 2 $\mu$m, and the concentration of the impurities of the n-type layers and the p-type layers are almost equal to the concentration in the above example, respectively, and the dopant can be doped with forming each film. In this case, it is preferable that the bottom layer and the top layer have the higher concentration of impurities than other layers. Due to this structure, the p-n junction area can be enlarged greatly, the series resistance is reduced, so it is possible to apply high electric current and have a built-in protective diode having the high breakdown strength. Also, in this case, one edge of the protective diode, the lowest layer and other edge, top layer are contacted by the metal films which are formed as a continuation of the gate electrode pad 2 and the source wiring 3. They can be contacted by whichever the source wiring or the gate electrode pad.

Although the above each example is example of the vertical MOSFET, an insulating gate type bipolar transistor (IGBT) installed additionally a bipolar transistor into the vertical MOSFET is produced as well as the vertical MOSFET, in a bipolar transistor, there is the unoccupied space on the external side of the chip and the protective diode can be formed on the insulating layer to prevent breakdown between the base and the emitter when the protective diode is connected between the electrodes, as well as the vertical MOSFET.

According to the present invention, the protective diode can be formed by using unoccupied space of the semiconductor chip without enlarging the gate electrode pad composed of polysilicon, and it is possible to get very large electrostatic breakdown strength since the series resistance reduce with keeping desire break down voltage. As a result, the reliable semiconductor device having the small semiconductor chip including many cells and the large electrostatic breakdown strength, can be provided.

INDUSTRIAL APPLICATION

According to the present invention, the switching semiconductor device having the large electrostatic breakdown strength and the high electric current is obtained. So it is used for DVDs, portable audios, power source ICs such as switching power source, motor drivers, and solenoid drives.

What is claimed is:

1. A semiconductor device comprising:
   an insulating gate field effect transistor comprising a plurality of transistor cells connected in parallel and arranged in a semiconductor layer of a first conductivity type; and
   a protective diode connected between a gate and a source of said insulating gate field effect transistor to prevent breakdown due to a voltage greater than or equal to a particular value,
   wherein said protective diode is formed as a bidirectional diode in which one or more closed ring-shaped p-type layers and one or more closed ring-shaped n-type layers are flatly and alternately provided on an insulating layer at a peripheral portion of a region of said transistor cells, a source wiring contacts with the most inner layer of said protective diode, and a closed ring-shaped metal film contacts with the most outer layer of said protective diode, said closed ring-shaped metal film being successively formed with a gate electrode pad comprising a metal film;
   wherein said ring-shaped metal film substantially contacts the full circumferential length of the most outer layer; and
   wherein said ring-shaped metal film is a gate wiring which has gate connecting portions so as to connect to gate electrodes of said transistor cells with partial striding over said protective diode, and said gate connecting portions and source connecting portions of said source wiring which are contacted with said most inner layer are alternately formed in plan view.

2. The semiconductor device of claim 1, wherein said p-type layers and said n-type layers are made of at least one selected from polysilicon, amorphous silicon, single-crystal silicon on a insulating layer, SiC and SiGe.

3. The semiconductor device of claim 1, wherein said p-type layers and said n-type layers are formed so as to have the same width and the same concentration of impurities, in the same conductivity type, respectively.

4. The semiconductor device of claim 1, wherein a diffusion region having a conductivity type different from said first conductivity type is formed on the closest side to said protective diode of said transistor cells, said diffusion region having no other diffusion region therein, and said source wiring contacted to the most inner layer of said protective diode is contacted to said diffusion region.

5. A semiconductor device comprising:
an insulating gate field effect transistor comprising a plurality of transistor cells arranged in a semiconductor layer and connected in parallel;
a protective diode connected between a gate and a source of said insulating gate field effect transistor to prevent breakdown due to a voltage greater than or equal to a particular value, said protective diode formed as bidirectional diode having at least one closed ring-shaped p-type layer, flatly and alternately provided with at least one closed ring-shaped n-type layer, on an insulating layer at a peripheral portion of a region of said transistor cells,
a source wiring in contact with the most inner layer of said protective diode, and
a gate wiring of a closed ring-shaped metal film substantially contacting the full circumferential length of the outermost layer of said protective diode;
wherein said closed ring-shaped metal film comprises a connection to a gate electrode pad, said connection partially striding over said protective diode.

* * * * *